(12) United States Patent
Wung et al.

(10) Patent No.: US 7,425,349 B2
(45) Date of Patent: *Sep. 16, 2008

(54) METHOD OF MANUFACTURING A LOW TEMPERATURE POLYSILICON FILM

(75) Inventors: Chien-Shen Wung, Hsinchu (TW); Mao-Yi Chang, Taipei (TW); Chih-Chin Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/625,825

(22) Filed: Jan. 23, 2007

(65) Prior Publication Data
US 2007/0117290 A1    May 24, 2007

Related U.S. Application Data

(63) Continuation of application No. 10/604,883, filed on Aug. 25, 2003, now Pat. No. 7,195,798.

(30) Foreign Application Priority Data
Mar. 28, 2003    (TW)    ............................... 92107061 A

(51) Int. Cl.
*B05D 5/00* (2006.01)
*B05D 3/00* (2006.01)
*C23C 16/00* (2006.01)

(52) U.S. Cl. .................... 427/259; 427/552; 427/255.7; 438/486; 438/482

(58) Field of Classification Search ................ 427/259, 427/552, 255.9; 438/486, 482
See application file for complete search history.

(56) References Cited

U.S. PATENT DOCUMENTS 7,195,798 B2 *    3/2007    Wung et al. ................. 427/259

* cited by examiner

*Primary Examiner*—Timothy Meeks
*Assistant Examiner*—David Turocy
(74) *Attorney, Agent, or Firm*—Jianq Chyun IP Office

(57) ABSTRACT

A method of manufacturing a low temperature polysilicon film is provided. A first metal layer is formed on a substrate; and openings have been formed in the first metal layer. A second metal layer is formed on the first metal layer; and a hole corresponding to each of the openings is formed in the second metal layer. A silicon layer is formed on the second metal layer; a silicon seed is formed on the substrate inside each of the holes. After removing the first and the second metal layers, an amorphous silicon layer is formed on the substrate by using the silicon seed. Then a laser crystallization step is performed to form a polysilicon layer from the amorphous layer. Since the position of the silicon seed can be controlled, the size and distribution of the silicon grain and the number of the silicon crystal interface can also be controlled.

18 Claims, 3 Drawing Sheets

METHOD OF MANUFACTURING A LOW TEMPERATURE POLYSILICON FILM

CROSS-REFERENCE TO RELATED APPLICATION

This is a continuation application of Ser. No. 10/604,883, filed on Aug. 25, 2003, now U.S. Pat. No. 7,195,798 which claims the priority benefit of Taiwan application serial no. 92107061, filed Mar. 28, 2003. The entirety of each of the above-mentioned patent applications is hereby incorporated by reference herein and made a part of this specification.

BACKGROUND OF THE INVENTION

1. Field of the Invention

The present invention relates to a low temperature polysilicon film. More particularly, the present invention relates to a method for controlling the nucleation position of the crystallization of the low temperature polysilicon film.

2. Description of the Related Art

In the development of the process of the thin film transistor (TFT) liquid crystal display (LCD), a technology of low temperature polysilicon TFT has become a trend in recent years. The technology of low temperature polysilicon TFT is a novel TFT technology compared with conventional amorphous silicon TFT. The electronic mobility of the novel TFT technology has been at least up to 200 $cm^2$/V-sec, and therefore the size of the chip area is reduced and the aperture ratio is increased. Moreover, because of the enhancement of the electronic mobility of the novel TFT technology, a part of the driving circuit can be manufactured on the glass substrate along with the TFT manufacturing process. Thus the cost of the novel TFT technology is much lower than that of the conventional amorphous silicon TFT. In addition, because the LCD produced with the low temperature polysilicon TFT has a thinner thickness, a lighter weight and a higher resolution in comparison with the LCD produced with conventional amorphous silicon TFT, the novel technology is especially applicable for electronic products that are power saving, handy, and portable.

In the conventional manufacturing process of the low temperature polysilicon TFT, the manufacturing method of the low temperature polysilicon film includes the steps of forming an amorphous silicon layer on the substrate by a chemical vapor deposition (CVD) method and of directly proceeding with a laser crystallization process. However, the nucleation position of the crystallization process is not under control in the conventional laser crystallization process of transforming the amorphous polysilicon film to the polysilicon film. In addition, the grain sizes of the crystal are not uniform after the laser crystallization process, thus the number of grain interfaces in the channel of each TFT will be different, and if the number of grain interfaces in the channel is too large, the electric property and the stability of the TFT will be reduced.

SUMMARY OF THE INVENTION

Accordingly, one object of the present invention is to provide a manufacturing process of low temperature polysilicon TFT in which the position of the crystal grain is controlled by controlling the position of the crystal seed during the nucleation process of the amorphous silicon film.

It is another object of the present invention to provide a manufacturing process of low temperature polysilicon TFT in which the uniformity of the grain size and the grain distribution in the conventional manufacturing process can be resolved.

It is another object of the present invention to provide a manufacturing process of low temperature polysilicon TFT in which the number of grain interfaces in the channel of the TFT can be reduced and the number of grain interfaces in the channel of the TFT can be controlled in a predetermined range of all of the TFTs.

In order to achieve the above objects and other advantages of the present invention, a manufacturing method of low temperature polysilicon film is provided. The method comprising the steps are described below. First, forming a first metal layer on a substrate in which a plurality of openings contiguous to the substrate is formed in the first metal layer. Second, forming a second metal layer on the first metal layer by performing an oblique evaporation step in which a hole is formed in the second metal layer corresponding to each of the openings. Third, forming a silicon layer on the second metal layer in which a silicon seed is formed on the substrate inside each of the holes. Fourth, removing the first metal layer and the second metal layer. And then forming an amorphous silicon layer on the substrate by using the silicon seed for performing a deposition process. And finally, transforming the amorphous layer to a polysilicon layer by performing a crystallization step.

In order to achieve the above objects and other advantages of the present invention, a method of controlling a crystal seed position is provided. The method comprising the steps are described below. First, forming a first metal layer on a substrate in which a plurality of openings contiguous to the substrate is formed in the first metal layer. Second, forming a second metal layer on the first metal layer by performing an oblique evaporation step in which a plurality of holes are formed in the second metal layer corresponding to the plurality of openings. Third, forming a crystal seed layer on the second metal layer in which a silicon seed is formed on the substrate inside each of the holes. And finally, removing the first metal layer and the second metal layer.

Accordingly, because the position of the crystal seed is effectively controlled, the nucleation position of the crystal grain during the crystallization process can also be controlled. Furthermore, because the grain size and the grain distribution can be controlled, the number of grain interfaces in the channel of the TFT can be reduced, and the electric property and the stability of the TFT will be enhanced.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings in which preferred embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductivity type embodiment as well.

Figure 1A:
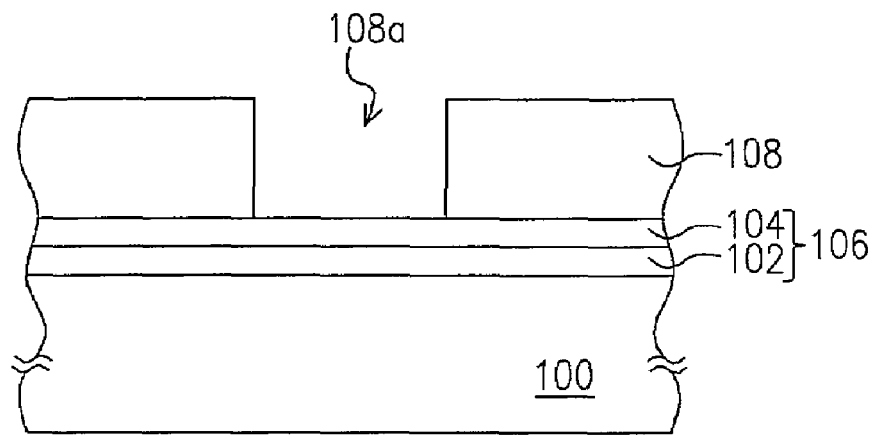
FIG. 1A to FIG. 1G schematically illustrate the cross-sectional diagrams of a manufacturing process flow of low temperature polysilicon film of a preferred embodiment of the present invention.

The present invention provides a manufacturing method of low temperature polysilicon film. FIG. 1A to FIG. 1G schematically illustrate the cross-sectional diagrams of a manufacturing process flow of low temperature polysilicon film of a preferred embodiment of the present invention. Referring to FIG. 1A, there is provided a substrate 100 first, the material of the substrate 100 includes, but is not limited to, glass or plastic. Second, there is formed a first metal layer 106 on the substrate 100. In a preferred embodiment of the present invention, the first metal layer 106 is composed of, for example but not limited to, a bottom metal layer 102 and a top metal layer 104.

Figure 2:
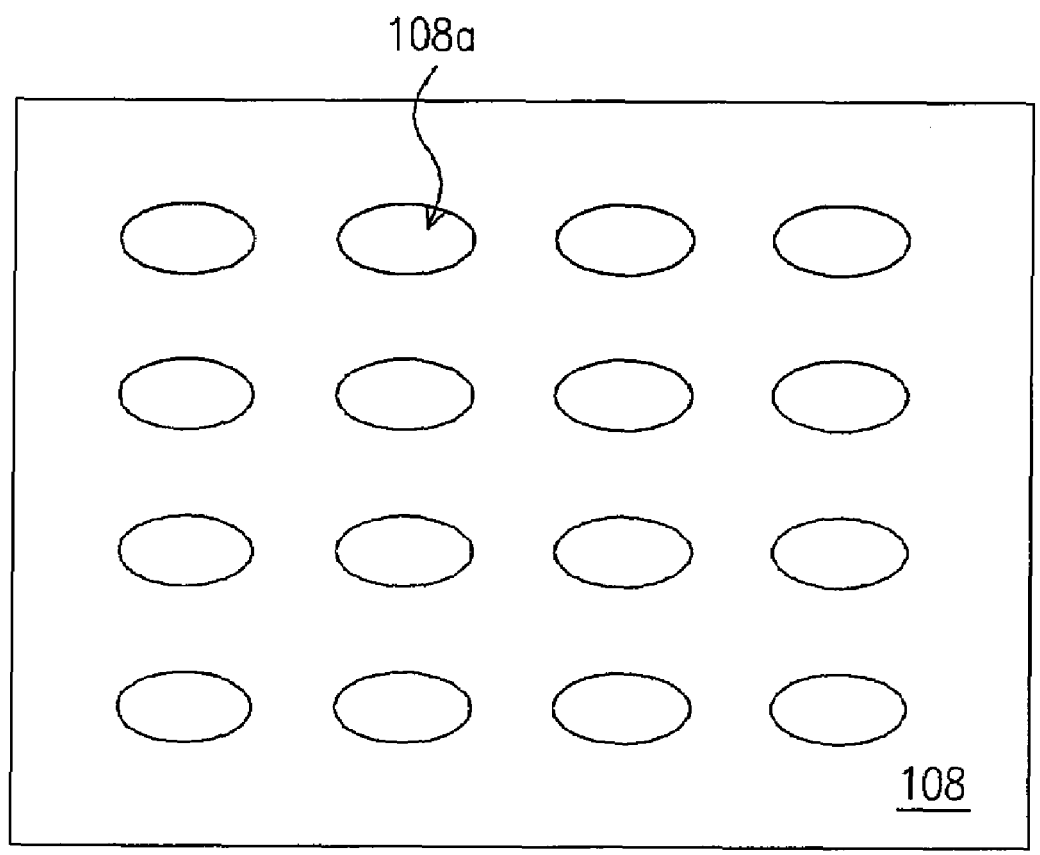
FIG. 2 is a top view schematically illustrating the photo resistant layer shown in FIG. 1.

After that, a photo resistant layer 108 is formed on the first metal layer 106 in which an opening pattern 108a is formed in the first metal layer. If the present invention is provided for a manufacturing method of low temperature polysilicon TFT of LCD, the top view of the photo resistant layer 108 may be similar to the diagram shown in FIG. 2 in which the arrangement of the opening pattern 108a is arranged in a regular array.

Figure 1B:
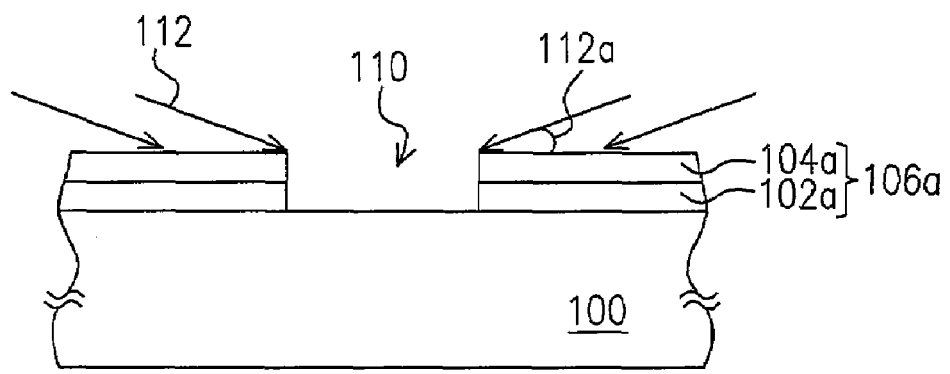

Referring to FIG. 1B, an opening 110 contiguous to the substrate 100 in the first metal layer 106 is formed by etching the first metal layer 106 using the photo resistant layer 108 as an etching mask. Thus, a patterned first metal layer 106 composed by the patterned bottom metal layer 102a and the patterned top metal layer 104a is formed.

Figure 1C:
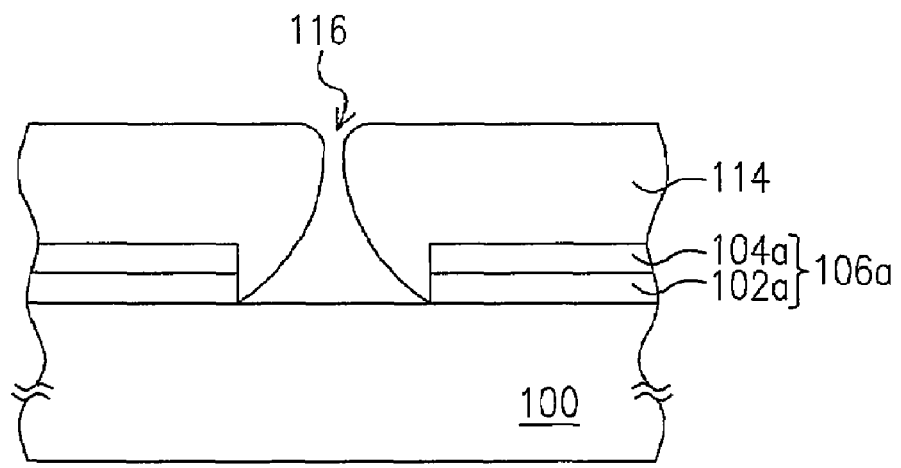

Thereafter, the oblique evaporation step 112 is performed for forming a second metal layer 114 on the patterned first metal layer 106a in which a hole 116 is formed in the second metal layer 114 corresponding to the opening 110 as shown in FIG. 1B and FIG. 1C. The oblique evaporation step 112 includes, but is not limited to, an electron beam evaporation step, and an oblique angle 112a of the oblique evaporation step 112 is, for example but not limited to, in a range of about 10 degrees to 30 degrees, 20 degrees being preferable.

In a preferred embodiment of the present invention, a material of the second metal layer 114 is the same as a material of the patterned bottom metal layer 102a of the patterned first metal layer 106a. This is preferred because the same etching solvent can be used to etch the second metal layer 114 and the patterned bottom metal layer 102a of the patterned first metal layer 106a. Therefore, both the second metal layer 114 and the patterned first metal layer 106a can be removed simultaneously.

Here, the material of the bottom metal layer 102 includes, but is not limited to, aluminum; the material of the top metal layer 104 includes, but is not limited to, chromium; and the material of second metal layer 114 includes, but is not limited to, aluminum.

Figure 1D:
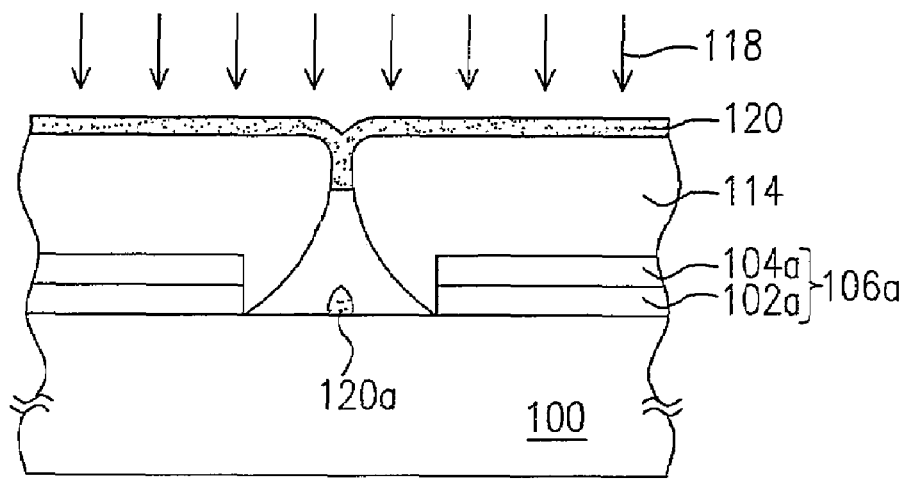

Referring to FIG. 1D, a silicon layer 120 is formed on the second metal layer 114; and a silicon seed 120a is formed on the substrate 100 inside the hole 116. The size (diameter) of the silicon seed 116 is in a range of about 0.5 μm to 1.0 μm. In a preferred embodiment of the present invention, the method of forming the silicon layer 120 includes, but is not limited to, an electron beam evaporation method 118.

Here, the silicon seed 120a is formed on the substrate 100 inside the hole 116 as shown in FIG. 1C. And the hole 116 is formed corresponding to the opening 110 as shown in FIG. 1B. Therefore, by controlling the position of the opening 110 in the patterned first metal layer 116a, the position of the silicon seed 120a can be controlled exactly.

Figure 1E:
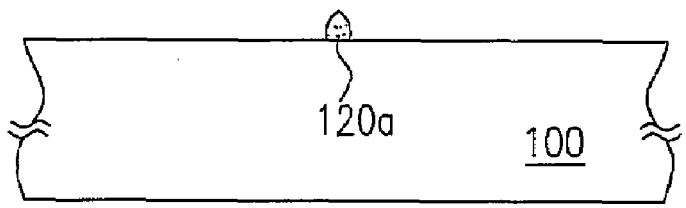

Referring to FIG. 1E, the patterned first metal layer 106a and the second metal layer 114 are removed, and only the silicon seed 120a remains. If the materials of both the patterned bottom metal layer 102a and the second metal layer 114 is, for example, aluminum, a method of removing both of the second metal layer 114 and the patterned first metal layer 106a includes, but is not limited to, a method by using a phosphoric acid.

Figure 1F:
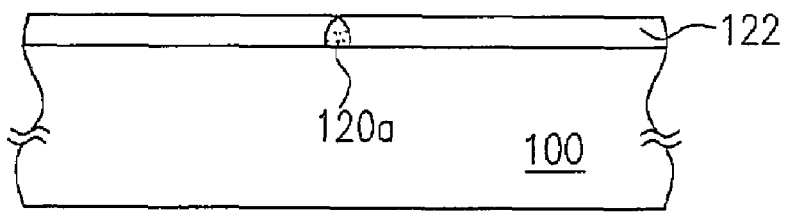

Referring to FIG. 1F, an amorphous silicon layer 122 on the substrate 100 is formed by using the silicon seed 120a for performing a deposition process. In a preferred embodiment of the present invention, a method of forming the amorphous silicon layer 122 includes, but is not limited to, a chemical vapor deposition (CVD) method. And a thickness of the amorphous silicon layer 122 formed is in a range of about 30 nm to 70 nm, 50 nm being preferable.

Figure 1G:
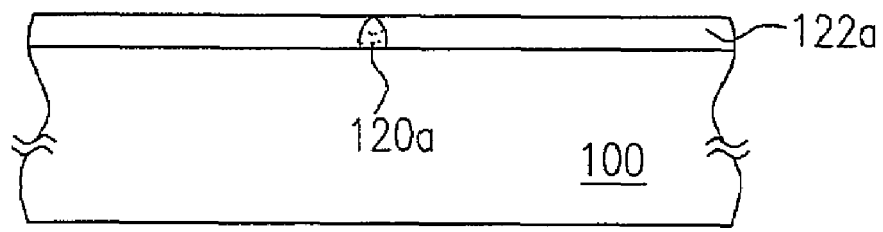

Referring to FIG. 1G, the amorphous layer 122 is transformed into a polysilicon layer 122a by performing a crystallization step. In a preferred embodiment of the present invention, the crystallization step includes, but is not limited to, a laser crystallization step.

Here, because the amorphous layer 122 is formed by using the silicon seed 120a as a seed during the crystallization process, the position of the silicon seed 120a can be controlled precisely by the method described above in the preferred embodiment of the present invention. Thus, the nucleation position can be controlled after the crystallization step.

Here, if the present invention provides for a manufacturing method of low temperature polysilicon TFT of LCD, the position of the crystal grain is controlled by controlling the position of the crystal seed by using the method provided in the invention. Therefore, the number of grain interfaces in the channel of the TFT can be reduced, and the number of grain interfaces in the channel of the TFT can be controlled in a predetermined range of all of the TFTs.

In the embodiment of the present invention, the position of the crystal grain of the low temperature polysilicon film is controlled by controlling the position of the crystal seed. However, the method of the controlling the position of the crystal seed by using the oblique evaporation method may not only provide for a manufacturing method of low temperature polysilicon film, but also provides for another method of manufacturing a thin film.

Accordingly, because of the position of the crystal seed is effectively controlled, the nucleation position of the crystal grain during the crystallization process can also be controlled. Furthermore, the grain size and the grain distribution can be controlled, and the number of grain interfaces in the channel of the TFT can be reduced, and the electric property and the stability of the TFT will be enhanced.

It will be apparent to those skilled in the art that various modifications and variations can be made to the features of the present invention without departing from the scope or spirit of the invention. In view of the foregoing, it is intended that the present invention cover modifications and variations thereof provided they fall within the scope of the following claims and their equivalents.

What is claimed is:

1. A method of manufacturing a low temperature polysilicon film, comprising the steps of:

forming a first metal layer on a substrate, a plurality of openings contiguous to the substrate being formed in the first metal layer;

forming a second metal layer on the first metal layer by performing an oblique evaporation and a hole being formed in the second metal layer corresponding to each of the openings;

forming a silicon layer on the second metal layer and a silicon seed being formed on the substrate inside each of the holes, wherein a size of the silicon seed is in a range of about 0.5 μm to 1.0 μm;

removing the first metal layer and the second metal layer;

forming an amorphous silicon layer on the substrate by using the silicon seed for performing a deposition process; and transforming the amorphous layer to a polysilicon layer by performing a crystallization.

2. The method of claim 1, wherein an angle of the oblique evaporation is in a range of about 10 degrees to 30 degrees.

3. The method of claim 1, wherein the oblique evaporation is an electron beam evaporation.

4. The method of claim 1, wherein the first metal layer is a bilayer metal layer structure.

5. The method of claim 4, wherein a material of the second metal layer is the same as a material of a bottom layer of the bilayer metal layer structure.

6. The method claim 5, wherein the material of both of the second metal layer and the bottom layer of the bilayer metal layer structure comprises aluminum.

7. The method of claim 6, wherein the step of removing the second metal layer and the first metal layer comprises using phosphoric acid.

8. The method of claim 1, wherein the step of forming the silicon seed on the substrate inside each of the holes comprises an electron beam evaporation.

9. The method of claim 1, wherein the crystallization comprises a laser crystallization.

10. The method of claim 1, wherein the step of forming an amorphous silicon layer comprises a chemical vapor deposition.

11. A method of controlling a crystal seed position, comprising the steps of:

forming a first metal layer on a substrate wherein a plurality of openings contiguous to the substrate is formed in the first metal layer;

forming a second metal layer on the first metal layer by performing an oblique evaporation and a plurality of holes being formed in the second metal layer corresponding to the plurality of openings;

forming a crystal seed layer on the second metal layer and a silicon seed being formed on the substrate inside each of the holes, wherein a size of the silicon seed is in a range of about 0.5 μm to 1.0 μm; and removing the first metal layer and the second metal layer.

12. The method of claim 11, wherein an angle of the oblique evaporation is in a range of about 10 degrees to 30 degrees.

13. The method of claim 11, wherein the oblique evaporation is an electron beam evaporation.

14. The method of claim 11, wherein the first metal layer is a bilayer metal layer structure.

15. The method of claim 11, wherein a material of the second metal layer is the same as a material of a bottom layer of the bilayer metal layer structure.

16. The method of claim 11, wherein the material of both the second metal layer and the bottom layer of the bilayer metal layer structure comprises aluminum.

17. The method of claim 11, wherein the step of removing both of the second metal layer and the first metal layer comprises using phosphoric acid.

18. The method of claim 11, wherein the step of forming the silicon seed on the substrate inside each of the holes comprises an electron beam evaporation.

* * * * *